United States Patent
Wickeraad

(10) Patent No.: US 10,586,594 B2
(45) Date of Patent: Mar. 10, 2020

(54) DATA TABLES IN CONTENT ADDRESSABLE MEMORY

(71) Applicant: Hewlett Packard Enetrprise Development LP, Houston, TX (US)

(72) Inventor: John A. Wickeraad, Granite Bay, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/757,357

(22) PCT Filed: Sep. 4, 2015

(86) PCT No.: PCT/US2015/048567
§ 371 (c)(1),
(2) Date: Mar. 3, 2018

(87) PCT Pub. No.: WO2017/039689
PCT Pub. Date: Mar. 9, 2017

(65) Prior Publication Data
US 2018/0247694 A1    Aug. 30, 2018

(51) Int. Cl.
*G11C 15/00* (2006.01)

(52) U.S. Cl.
CPC ................... *G11C 15/00* (2013.01)

(58) Field of Classification Search
CPC .................. G11C 15/00–06; H04L 45/7457
(Continued)

(56) References Cited

U.S. PATENT DOCUMENTS 6,134,135 A * 10/2000 Andersson ............. G11C 15/00
365/49.1
6,351,143 B1   2/2002 Guccione et al.
(Continued)

FOREIGN PATENT DOCUMENTS

CN      102842299 A    12/2012
EP       2220824 A0     8/2010
WO  WO 2009/076054 A1  6/2009

OTHER PUBLICATIONS

Aliev et al. "Cost-Efficient Architecture of IPsec Classification Engine with TCAM." Dec. 2017. IEEE. ICENCO 2017. pp. 20-25. (Year : 2017).*

(Continued)

*Primary Examiner* — Nathan Sadler
(74) *Attorney, Agent, or Firm* — Park, Vaughan, Fleming & Dowler LLP

(57) ABSTRACT

Examples disclosed herein relate, in one aspect, to an electronic device including a processor, a lookup engine, and a content addressable memory (CAM) including a plurality of data tables. The lookup engine may obtain from the processor a search word and a table identifier identifying a selected data table from the plurality of data tables, and using a lookup table, determine table parameters associated with the selected data table. The lookup engine may also generate search parameters based on the search word and the table parameters and provide the search parameters to the CAM. The search parameters may cause the CAM to determine whether the selected data table comprises a word corresponding to the search word, and if the selected data table comprises the word, to output an entry address of an entry of the CAM that comprises the word.

18 Claims, 4 Drawing Sheets

| Table ID | Column Offset | Column Mask | Row Mask |
|---|---|---|---|
| TCAM_T0 | 27 | 0b111111111000000000000000000000000 | 0b1110000000000000 |
| TCAM_T1 | 18 | 0b000000000111111111000000000000000 | 0b1110000000000000 |
| TCAM_T2 | 9  | 0b000000000000000000111111111000000 | 0b1110000000000000 |
| TCAM_T3 | 0  | 0b000000000000000000000000000111111111 | 0b1110000000000000 |
| TCAM_T4 | 19 | 0b111111111111111110000000000000000 | 0b0001111110000000 |
| TCAM_T5 | 0  | 0b000000000000000001111111111111111 | 0b0001100000000000 |
| TCAM_T6 | 15 | 0b000000000000000011100000000000000 | 0b0000011110000000 |
| TCAM_T7 | 0  | 0b000000000000000000111111111111111 | 0b0000011110000000 |
| TCAM_T8 | 0  | 0b111111111111111111111111111111111 | 0b0000000001111111 |

145

(58) Field of Classification Search
USPC .......................................................... 711/108
See application file for complete search history.

(56) References Cited

U.S. PATENT DOCUMENTS

| | | | | |
|---|---|---|---|---|
| 6,867,991 | B1* | 3/2005 | Tezcan | G11C 15/00 365/189.07 |
| 7,017,089 | B1* | 3/2006 | Huse | G11C 15/00 365/49.18 |
| 7,050,318 | B1* | 5/2006 | Argyres | G11C 7/12 365/189.07 |
| 7,356,033 | B2 | 4/2008 | Basu et al. | |
| 7,852,653 | B2* | 12/2010 | Wickeraad | G11C 15/00 365/49.1 |
| 8,966,167 | B1 | 2/2015 | Estan | |
| 2008/0259667 | A1* | 10/2008 | Wickeraad | G11C 15/04 365/49.1 |
| 2011/0038375 | A1 | 2/2011 | Liu et al. | |
| 2011/0307656 | A1 | 12/2011 | Hamdi et al. | |
| 2015/0039823 | A1* | 2/2015 | Chen | G06F 16/90339 711/108 |
| 2015/0052298 | A1 | 2/2015 | Brand et al. | |
| 2015/0127900 | A1 | 5/2015 | Dharmapurikar et al. | |
| 2018/0210829 | A1* | 7/2018 | Wickeraad | G11C 15/00 |

OTHER PUBLICATIONS

International Searching Authority, The International Search Report and the Written Opinion, dated Jun. 3, 2016, PCT/US2015/048567, 9 Pgs.

Lin, D. et al., Route Table Partitioning and Load Balancing for Parallel Searching with TCAMs, (Research Paper), Jan. 14, 2007, 10 Pgs.

Meiners, C.R. et al., TCAM SPliT: Optimizing Space, Power, and Throughput for TCAM-based Packet Classification Systems, (Research Paper), Apr. 28, 2009, 14 Pgs.

* cited by examiner

*FIG. 2*

| Table ID | Column Offset | Column Mask | Row Mask |
|---|---|---|---|
| TCAM_T0 | 27 | 0b111111111000000000000000000000000000 | 0b1110000000000000 |
| TCAM_T1 | 18 | 0b000000000111111111000000000000000000 | 0b1110000000000000 |
| TCAM_T2 | 9 | 0b000000000000000000111111111000000000 | 0b1110000000000000 |
| TCAM_T3 | 0 | 0b000000000000000000000000000111111111 | 0b1110000000000000 |
| TCAM_T4 | 19 | 0b111111111111111110000000000000000000 | 0b0001111111000000 |
| TCAM_T5 | 0 | 0b000000000000000001111111111111111111 | 0b0001100000000000 |
| TCAM_T6 | 15 | 0b000000000000000001111000000000000000 | 0b0000011111000000 |
| TCAM_T7 | 0 | 0b000000000000000000000111111111111111 | 0b0000011111000000 |
| TCAM_T8 | 0 | 0b111111111111111111111111111111111111 | 0b0000000001111111 |

*FIG. 3*

DATA TABLES IN CONTENT ADDRESSABLE MEMORY

BACKGROUND

A content addressable memory (CAM) is a useful device for executing table lookup operations. Particularly, because of the parallel lookup capability, a device can execute thousands or even millions of comparisons with one lookup operation that may in some cases take no more than a single clock cycle.

BRIEF DESCRIPTION OF THE DRAWINGS

The following detailed description references the drawings, wherein:

FIG. 2 is a block diagram of an example content addressable memory;

FIG. 3 is a block diagram of an example lookup table;

DETAILED DESCRIPTION

Figure 1:
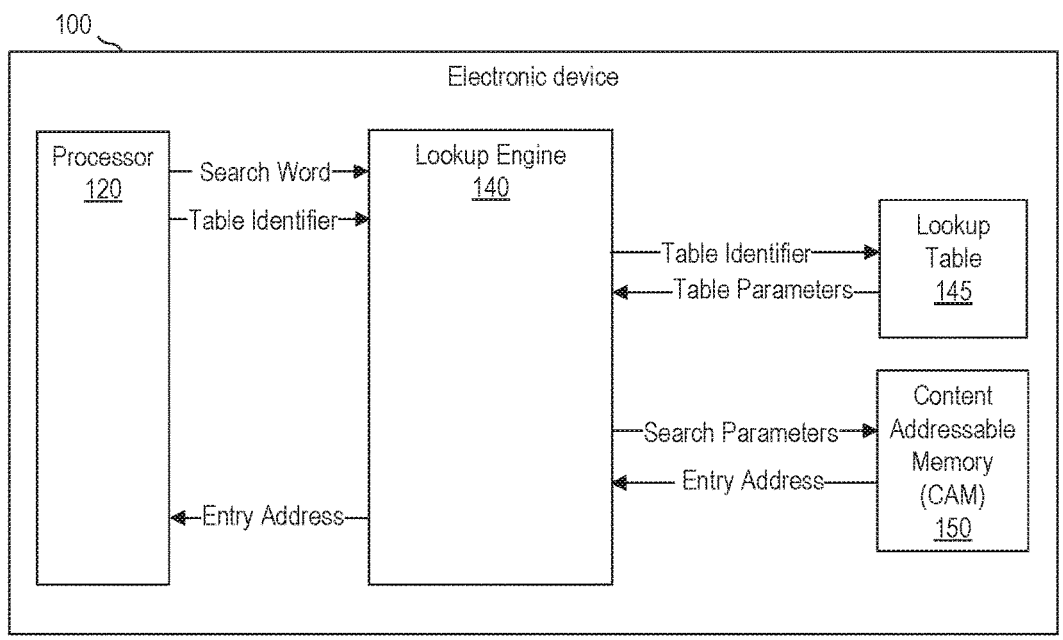
FIG. 1 is a block diagram of an example electronic device.

For computer systems, a CAM is widely used as the address lookup table for cache memory (called cache TAG), or as the paging translation look-aside buffer (TLB). For communication applications, a CAM is used to support address lookup operations for routers. Recently, the rapid growth of networking systems has triggered demand for high density and high speed CAM devices. CAM devices may include binary CAM (BCAM) devices that can only store "0" and "1" bits, and ternary CAM (TCAM) devices that can also store "don't-care" or "X" bits. Accordingly, a BCAM may store fully specified data, such as fully specified IP addresses, while a TCAM may store fully specified data as well as partially masked data, such as data specifying a sub-network (e.g., 192.168.20.16/22) corresponding to multiple IP addresses.

Different applications may need to store different types and amounts of data in a CAM, and therefore may need CAMs of different widths and depths, where a CAM's width corresponds to the number of entries it may store and a CAM's depth corresponds to the maximum length of each entry. Systems and methods discussed here in describe, among other things, an electronic device comprising a CAM device that stores a plurality of logical tables of different widths and depths, where the dimensions and locations of the logical tables within the CAM may be modified, for example, by a user of the electronic device, such as a manufacturer, a customer, a system administrator, etc. In some examples, an individual logical table may be fully searched in a single search operation (e.g., in a single clock cycle) where the search disregards data stored in other logical tables. As a result, the CAM's utilization may be increased, meaning that a smaller CAM may be used for a given number of applications. This may reduce the size, cost, power consumption, and heat generation of the electronic device, and otherwise improve its characteristics.

In some examples, a CAM may obtain a search key and find any entries within the CAM that match the search key. In some examples, a matching entry may be an entry in which every bit is either equal to a corresponding bit in the search key, or is an "X" (i.e., "don't-care") bit in the case of a TCAM. In some examples, the CAM may also obtain a row mask and a column mask, where the row mask may sometimes be referred to as a set of row-enable or row-valid bits, and the column mask may sometimes be referred to as a global mask.

The column mask may have the same width as the CAM, and may indicate, for each column of the CAM, whether or not each entry's data stored in that column should be disregarded when the CAM is searched. Put differently, the column mask may indicate one or more "masked off" columns whose data should be disregarded (or regarded as "X" data) during each entry's comparison to the search key, such that the entry could be considered a matching entry if its data in non-disregarded columns corresponds to the search key, irrespective of its data in the disregarded columns. For example, a column mask of "110100 . . . " may indicate that data stored in the first, second, and fourth columns of each entry (i.e., of each row) should not be disregarded (i.e., should match the search key in a matching entry), and data stored in the third, fifth, and sixth columns of each entry should be disregarded during the search (i.e., may or may not match the search key in a matching entry). In some examples, in addition to the column mask, the CAM may obtain, with the search key, a search key mask that may optionally mask off additional columns, as will be discussed below.

Similarly, the row mask may indicate, for each row of the CAM whether or not that row should excluded from the search. A row that is excluded may not be selected as a matching entry even if its data happens to correspond to the search key. For example, a row mask of "010001 . . . " may indicate that the second and sixth rows should be included in the search (i.e., may include matching entries), while the data in the first, third, fourth, and fifth rows should be excluded from the search. In some implementations, the CAM may include one or more row-enable or row-valid signals (or bits), where each signal may be associated with or coupled to one or more rows, and may control whether or not the one or more rows should be excluded from the search. While in some examples discussed herein, "0" bits represent disregarded columns and excluded rows and "1" bits represent non-disregarded columns and non-excluded rows, it is appreciated that in other examples the bit representation may be reversed, and that other types of representation is possible.

After identifying a matching entry (or the highest-priority matching entry if multiple matching entries were identified), the CAM may output the matching entry's address within the CAM. In some examples, this address may be used as an index to another memory (e.g., RAM) storing data.

Examples discussed herein describe, among other things, an electronic device that includes a processor, a lookup engine, and a content addressable memory (CAM) that includes a plurality of data tables. In some examples, the lookup engine may obtain from the processor a search word and a table identifier identifying a selected data table from the plurality of data tables, and using a lookup table, determine table parameters associated with the selected data table. The lookup engine may also generate search parameters based on the search word and the table parameters and provide the search parameters to the CAM. The search parameters may cause the CAM to determine whether the selected data table comprises a word corresponding to the search word, and if the selected data table comprises the word, to output an entry address of an entry of the CAM that comprises the word.

FIG. 1 is a block diagram of an example electronic device 100. Electronic device 100 may include any type of an electronic device or a combination of electronic devices. For example, electronic device 100 may include a network device (e.g., a network switch, a network router, etc.), a server, a desktop computer, a notebook computer, a tablet computer, a mobile phone, a smartphone, a gaming device, a printing device, and so forth.

Electronic device 100 may include a processor 120. Processor 120 may include one or multiple processors, such as central processing units (CPUs), semiconductor-based microprocessors, hardware state machines, graphics processing units (GPUs), field-programmable gate arrays (FPGAs), or other electronic circuitry, which may be integrated in a single device or distributed across devices. In some examples, processor 120 may also be implemented as a combination of hardware and programming, as will be further discussed below.

Electronic device 100 may also include a content addressable memory (CAM) 150 communicatively coupled to processor 120. CAM 150 and processor 120 may be located on the same physical device or on separate physical devices, e.g., if electronic device 100 is implemented as a number of interconnected physical devices. CAM 150 may include any type of content addressable memory, such as a ternary content addressable memory (TCAM), a binary content addressable memory (SCAM), or any other type of memory capable of storing data entries, receiving a search key, finding an entry matching the search key, and returning the entry's address within the memory. While in the following discussion CAM 150 is referred to in a singular form, it is appreciated that in some examples, CAM 150 may include a plurality of smaller CAM devices (or "tiles") that may be arranged, for example, in a two-dimensional array. Thus, in some examples, the functionality of CAM 150 as discussed herein may be implemented using a plurality of physical CAM devices configured to seamlessly act as a single, larger CAM device.

Electronic device 100 may also include a lookup engine 140 that may be communicatively coupled to processor 120 and CAM 150. Lookup engine 140 may be implemented as any combination of hardware and processing capable of performing the functionalities discussed below. In some examples, lookup engine 140 may be a part of processor 120 or a part of CAM 150. In some examples, some of the engine's functionality may be included in (e.g., performed by) processor 120 and/or some of the engine's functionality may be included in (e.g., performed by) CAM 150.

In some examples, electronic device 100 may also include or be coupled to a lookup table 145 storing information about the various logical tables (hereinafter, "data tables") stored on CAM 150, as will be discussed in more detail below. Lookup table 145 may be stored, for example, on any type of volatile or non-volatile memory such as a random-access memory (RAM), read-only memory (ROM), flash memory, hard drive, memristor-based memory, and the like, where the memory may be stored on electronic device 100 or on another device communicatively coupled to electronic device 100.

In some examples, CAM 150 may store a plurality of data tables, which, as discussed above, may be used by (or otherwise associated with) the same application or by similar applications. For example, FIG. 2 illustrates an example CAM 150 having 32 columns and 17 rows, and storing nine data tables indicated by table identifiers CAM_T0, CAM_T1, . . . CAM_T8. As illustrated in FIG. 2, each data table may have a different width, a different depth (or height), and a different location within CAM 150, where the location of each data table may be expressed in terms of its column offset (e.g., i.e., the number of columns between the data table's least significant bit and the least significant bit of CAM 150) and a row offset (e.g., an offset of zero, one, or more entries from the first entry). In some examples discussed herein, one row of CAM 150 may be referred to as an "entry," and a portion of a row included in the same data table may be referred to as a "word". Thus, some entries may include one word only, and some entries may include multiple words. As illustrated in FIG. 2, in some examples, the plurality of data tables may collectively occupy the entire space of CAM 150. In other examples, however, some space of CAM 150 may be reserved or unused. In some examples, each word in each table may include a "valid" bit indicating whether the word includes valid (e.g., meaningful) data. In some examples, each entry may also include a "valid" bit, indicating whether at least one word in that entry is valid.

As illustrated in FIG. 3, in some examples, lookup table 145 may store table parameters associated with each data table in CAM 150. In some examples, the table parameters may include data indicating, for each data table stored in CAM 150, that table's dimensions and position within CAM 150. The dimensions and position of a data table may be defined, for example, by a set of columns and a set of rows corresponding to (e.g., occupied by) the data table. In some examples, the table parameters may specify, for each data table, its column offset indicating the position of the last column of the data table relative to the last column (e.g., column number 35) of CAM 150.

The table parameters may also specify a column mask and a row mask associated with each data table. As discussed above, the column mask associated with each data table may indicate or define which columns of CAM 150 need to be searched and which columns of CAM 150 need to be disregarded (i.e., ignored or masked off) when searching for matching entries within the data table. In the example illustrated in FIG. 3, data table identified as CAM_T6 is associated with a column mask 0b00000000000000001111000000000000000 indicating that in order to search CAM_T6 and disregard data in all other data tables in CAM 150, only columns 15-18 need to be searched, and all other columns of CAM 150 need to be disregarded.

Similarly, the row mask associated with each data table may indicate or define which rows of CAM 150 need to be searched and which rows of CAM 150 need to be excluded from search (i.e., not searched) when searching for matching entries within the data table. In the example illustrated in FIG. 3, data table CAM_T6 may be associated with a row mask 0b00000111110000000 indicating that in order to search CAM_T6 and disregard data in all other data tables in CAM 150, only rows 5-9 need to be searched, and all other rows of CAM 150 should be excluded from the search. In some examples, instead of storing the row mask and the column mask for each column, lookup table 145 may store information based on which the masks can be generated (e.g., by lookup engine 140).

Referring back to FIG. 1, in some examples, lookup engine 140 may obtain from processor 120 a search word and a table identifier of a data table (e.g., one of the plurality of data tables stored in CAM 150) to be searched for the search word. In the following discussion, the data table identified by the table identifier may be referred to as the "selected" data table. In some examples, the search word and the table identifier may be included in an instruction or a command by processor 120 to search a selected data table in CAM 150 for the search word. In some examples, the width of the search word may correspond to the width of the selected data table to be searched, and therefore it may sometimes be smaller than the width of the entire CAM 150.

In some examples, lookup engine 140 may use (e.g., query) lookup table to determine the table parameters of the selected data table identified by the table identifier. As discussed above, in some examples, the table parameters may include a column offset, a row mask, and a column mask associated with the selected data table. In other examples, the table parameters may include another type of data describing the data table's dimensions and position, based on which lookup engine 140 may determine the column offset, the row mask, and the column mask.

In some examples, lookup engine 140 may generate search parameters based on the search word and the table parameters. Engine 140 may generate the search key based on the search word, for example, by logically shifting the search word to the left by a number of bits indicated by the column offset. For example, if engine 140 obtains a search word 0b1101 and a table identifier CAM_T6 (indicating that the application would like to search data table CAM_T6 for a word having a value of 0b1101), engine 140 may shift the search word to the left by 15 bits (a column offset associated with CAM_T6) to produce a search key of 0b0000000000000001101000000000000000, thereby aligning the position of the search word within the search key with the position of CAM_T6 in CAM 150.

In some examples, the search parameters may also include the column mask and the row mask associated with the selected data table. As discussed above, the column and row masks may be specified in lookup table 145 or determined by engine 140 based on other data included in lookup table 145. In some examples, in addition to the search word, lookup engine 140 may obtain from processor 120 a search word mask. The search word mask may indicate which bits of the search word may be disregarded during the search. Put differently, in some examples, the column mask may mask off any columns outside the selected data table, and the search mask may mask off columns within the selected data table. In these examples, engine 140 may generate a search key mask based on the search word mask and the table parameters, e.g., by shifting the search word mask left by the column offset associated with the selected data table. Engine 140 may then include the search key in the search parameters provided to mask to CAM 150.

After determining the search parameters (e.g., the search key, the row mask, the column mask, and the search key mask), engine 145 may provide the search parameters to CAM 150. CAM 150, upon receiving the search parameters (and in some examples, a signal or command to perform search) may search its data to find an entry (i.e., a row) that is not excluded by the row mask, and that matches the search key after some of the entry's columns are optionally disregarded in accordance with the column mask. Put differently, the search parameters as described above may cause CAM 150 to search only the selected data table for a word matching the search word, while disregarding data of all other data tables included in CAM 150. After finding the matching word, CAM 150 may output (e.g., to engine 140) the address of the matching entry comprising the matching word within CAM 150. In some examples, e.g., if CAM 150 is a TCAM, multiple matching entries may be found, in which case the address of the matching entry associated with the highest priority may be output by CAM 150. The address of the matching entry may be referred to as the "entry address." In some examples, engine 140 may output the entry address to electronic device 100, as illustrated in FIG. 1.

Figure 4:
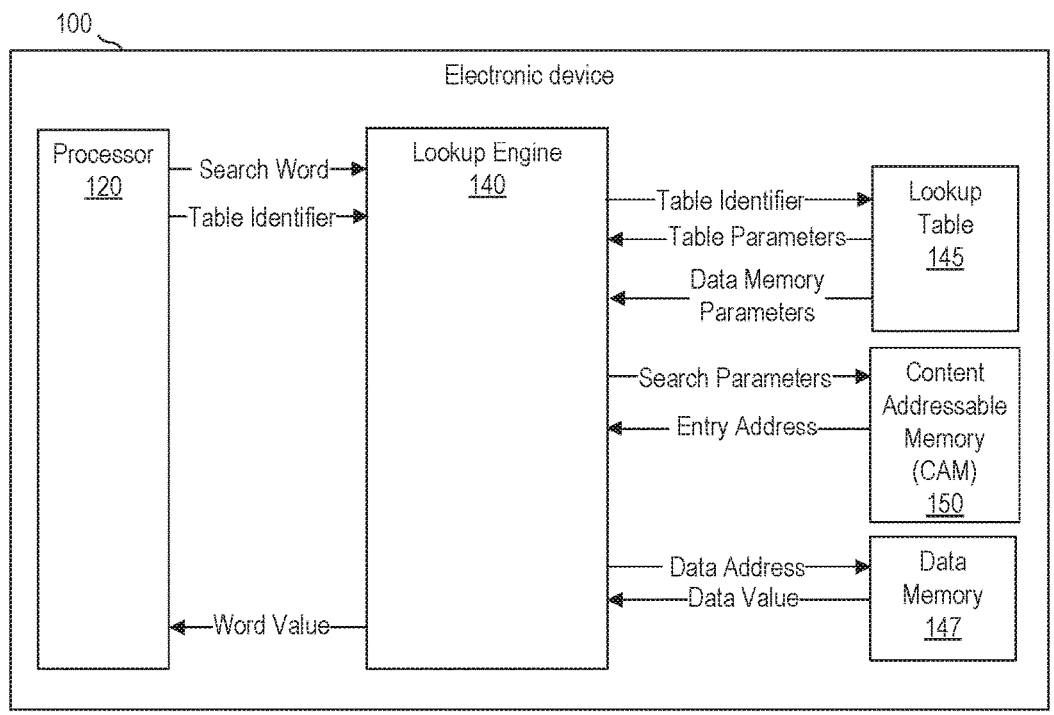
FIG. 4 is another block diagram of an example electronic device.

In some examples, as illustrated in FIG. 4, electronic device 100 may also include or be coupled to a data memory 147. Data memory 147 may be any type of volatile or non-volatile memory such as a random-access memory (RAM), read-only memory (ROM), flash memory, hard drive, memristor-based memory, and the like. Data memory 147 may be stored on electronic device 100 or on another device communicatively coupled to electronic device 100. In some examples, data memory 147 may include lookup table 145.

In some examples, engine 140, after obtaining the entry address from CAM 150, may obtain from data memory 147 a data value stored at an address (referred to herein as the "data address") associated with the entry address. The data address may be associated with the entry address. For example, engine 140 may determine the data address by adding the entry address to a fixed predefined offset. Thus, in some examples, the entry address may serve as an index into data memory 147. Engine 140 may provide or otherwise indicate the data address to data memory 147, and receive from data memory the data value stored at the data address. In some examples, engine 140 may provide the data value, unprocessed, to processor 120.

In other examples, engine 140 may provide to processor 120 a word value determined based on the data value. For example, each data value in data memory 147 may correspond to a particular entry (i.e., row) of CAM 150. Because some entries in CAM 150 may include two or more words, some data values in data memory 147 may also include values corresponding to two or more words. In these examples, engine 140 may obtain from lookup table 145 data memory parameters associated with the selected data table, and use the memory parameters to extract from the data value a word value corresponding to the word stored in the selected data table. For example, the memory parameters may indicate which bits in the data value correspond to the word of the selected data table, and engine 140 may extract only those bits from the data value to produce the word value. After extracting the word value, engine 140 may output the word value to processor 120.

In some examples, the allocation of space of CAM 150 to different data tables may be dynamically (e.g., programmatically) modified. For example, a user of electronic device 100 may access lookup table 145 (e.g., via a graphical user interface of an application running on electronic device 100 or on another device communicatively coupled to electronic device 100) and reorganize lookup table 145, thereby reorganizing the data tables in CAM 150. For example, when the user may add additional data tables, remove existing data tables, modify the dimensions (e.g., width and/or depth) of existing data tables, modify the locations (e.g., row offset and/or column offset) of existing data tables, and so forth. In some examples, an operating system or an application running on electronic device 150 may also automatically reorganize the data tables in CAM 150 by changing lookup table 145, for example by adding one or more new tables when the application starts, removing the table(s) when the application finishes, increasing or decreasing the depths of one or more existing tables based on changing demands of one or more applications using CAM 150, and so forth.

As mentioned above, in some examples, processors 120 and lookup engine 140 may each be implemented as any combination of hardware and programming. The programming may include processor executable instructions stored on a tangible, non-transitory computer readable medium and the hardware may include a processing resource for executing those instructions. The processing resource, for example, may include one or multiple processors (e.g., central processing units (CPUs), semiconductor-based microprocessors, graphics processing units (GPUs), field-programmable gate arrays (FPGAs) configured to retrieve and execute instructions, or other electronic circuitry), which may be integrated in a single device or distributed across devices. The computer readable medium can store program instructions that when executed by the processor resource implement the functionality of the respective component. The computer readable medium may be integrated in the same device as the processor resource or it may be separate but accessible to that device and the processor resource. In one example, the program instructions can be part of an installation package that when installed can be executed by the processor resource to implement the corresponding component. In this case, the computer readable medium may be a portable medium such as a CD, DVD, or flash drive or a memory maintained by a server from which the installation package can be downloaded and installed. In another example, the program instructions may be part of an application or applications already installed, and the computer readable medium may include integrated memory such as a hard drive, solid state drive, or the like.

Figure 5:
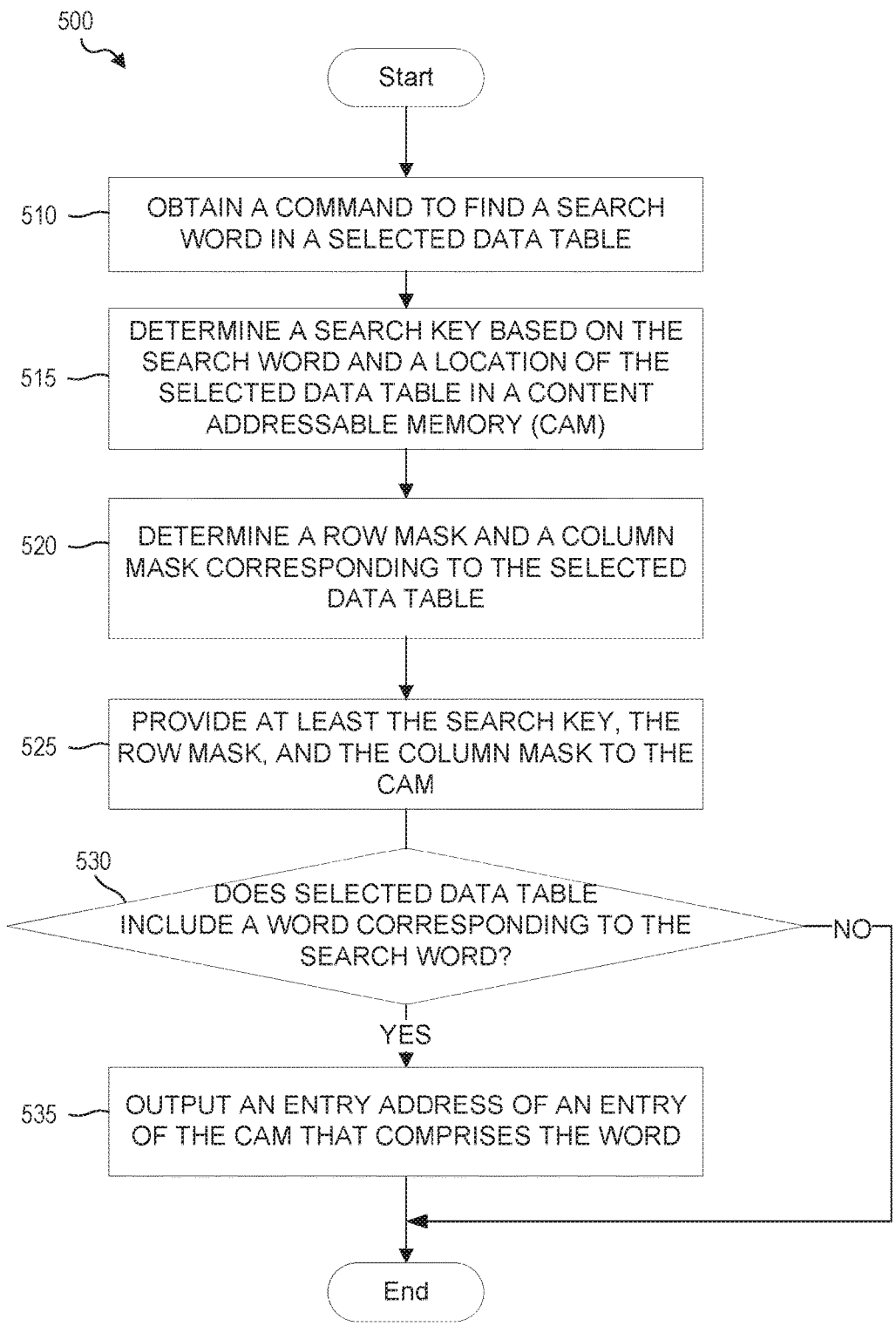
FIG. 5 is a flowchart of an example method for searching a content addressable memory.

FIG. 5 is a flowchart of an example method 500 for searching a content addressable memory (e.g., CAM 150) storing a plurality of data tables. Method 500 may be described below as being executed or performed by a one or more modules of an electronic device (e.g., 100). Other suitable systems and/or electronic devices may be used as well. Method 500 may be implemented in the form of executable instructions stored on at least one non-transitory machine-readable storage medium of the electronic device and executed by at least one processor of the electronic device. Alternatively or in addition, method 500 may be implemented in the form of electronic circuitry (e.g., hardware). In alternate examples of the present disclosure, one or more or blocks of method 500 may be executed substantially concurrently or in a different order than shown in FIG. 5. In alternate examples of the present disclosure, method 500 may include more or less blocks than are shown in FIG. 5. In some examples, one or more of the blocks of method 500 may, at certain times, be ongoing and/or may repeat.

At block 510, method 500 may obtain from a processor a command to find a search word in a selected data table from a plurality of data tables stored on a content addressable memory (CAM) coupled to the processor. At block 515, the method may determine a search key based on the search word and a location of the selected data table in the CAM. At block 520, the method may determine a row mask and a column mask corresponding to the location of the selected data table in the CAM and to dimensions of the selected data table. At block 525, the method may provide to the CAM at least the search key, the row mask, and the column mask. As discussed above, in some examples, the method may also provide to the CAM a search key mask. At block 530, the method may determine whether the selected data table comprises a word corresponding to the search word. If the selected data table comprises the word corresponding to the search word, the method may proceed to block 535 where the method may output an entry address of an entry of the CAM that comprises the word. In some examples, instead of outputting the entry address, the method may output an indication of whether or not a matching entry has been found. In other examples, instead or in addition to outputting the entry address, the method may output data stored in a memory (e.g., RAM) at an address corresponding to the entry address.

What is claimed is:

1. A processor coupled to a lookup engine and a content addressable memory (CAM) storing a plurality of data tables, wherein the processor is to send to the lookup engine a command to search a selected data table from the plurality of data table for a search word, wherein the command is to cause the search engine to:
receive search parameters that comprise a search key, a column mask, and a row mask;
determine a set of rows and a set of columns associated with the selected data table based on the row mask and column mask, wherein a respective bit in the row mask indicates whether a corresponding entry in the selected data table is excluded from a search;
cause the CAM to perform the search in the set of rows for an entry comprising the search word in the set of columns; and
obtaining from the CAM an entry address of the entry comprising the search word in the set of columns.

2. The processor of claim 1, wherein the processor is to further cause the lookup engine to:
obtain a data value stored in a data memory at a data address associated with the entry address.

3. The processor of claim 1, wherein causing the CAM to perform the search comprises marking rows in the selected data table that are not included in the set of rows as invalid.

4. The processor of claim 1, wherein the search key is generated by shifting the search word by a number of bits indicated by a column offset of the selected search table, and wherein the column offset of the search table is determined based on a location of the selected data table within the CAM.

5. An electronic device comprising a processor, a lookup engine, and a content addressable memory (CAM) comprising a plurality of data tables, wherein the lookup engine is to:
obtain, from the processor, a search word and a table identifier identifying a selected data table from the plurality of data tables;
using a lookup table, determine table parameters associated with the selected data table;
generate search parameters based on the search word and the table parameters, wherein the search parameters comprise a column mask and a row mask, and wherein a respective bit in the row mask indicates whether a corresponding entry in the selected data table is excluded from a search; and
perform the search by providing the search parameters to the CAM, wherein the search parameters are to cause the CAM to determine whether the selected data table comprises a word corresponding to the search word, and if the selected data table comprises the word, to output an entry address of an entry of the CAM that comprises the word.

6. The electronic device of claim 5, wherein the table parameters indicate a set of columns and a set of rows corresponding to a location of the selected data table within the CAM.

7. The electronic device of claim 5, wherein:
the table parameters indicate a column offset of the selected data table;
the search parameters comprise a search key; and
the lookup engine is to generate the search key based on the search word and the column offset.

8. The electronic device of claim 7, wherein the search key is generated by shifting the search word by a number of bits indicated by the column offset.

9. The electronic device of claim 5, wherein the lookup engine is further to obtain the entry address from the CAM, and to provide the entry address to the processor.

10. The electronic device of claim 5, wherein the lookup engine is further to:
obtain the entry address from the CAM;
obtain a data value stored in a data memory at a data address associated with the entry address; and
provide to the processor a word value associated with the data value.

11. The electronic device of claim 10, wherein the lookup engine is further to:
obtain, from the lookup table, data memory parameters associated with the table identifier; and
determine the word value based on the data value and the data memory parameters.

12. The electronic device of claim 5, wherein at least two of the plurality of data tables comprise a different number of entries, and wherein at least two of the plurality of data tables are associated with different entry lengths.

13. The electronic device of claim 5, wherein the lookup table is dynamically modifiable by an application running on the electronic device.

14. A method comprising:
obtaining from a processor a command to find a search word in a selected data table from a plurality of data tables stored on a content addressable memory (CAM) coupled to the processor;
determining a search key based on the search word and a location of the selected data table in the CAM;
determining a row mask and a column mask corresponding to the location of the selected data table in the CAM and to dimensions of the selected data table wherein a respective bit in the row mask indicates whether a corresponding entry in the selected data table is excluded from a search;
performing the search by providing to the CAM the search key, the row mask, and the column mask;
determining whether the selected data table comprises a word corresponding to the search word; and
if the selected data table comprises the word corresponding to the search word, outputting an entry address of an entry of the CAM that comprises the word.

15. The method of claim 14, where the row mask and the column mask are determined based on a lookup table, wherein the lookup table comprises table parameters associated with each of the plurality of data tables.

16. The method of claim 15, wherein the table parameters are dynamically modifiable by an application being executed by the processor.

17. The method of claim 14, further comprising:
obtaining a data value stored in a data memory at a data address associated with the entry address; and
providing to the processor a word value associated with the data value.

18. The method of claim 14, wherein determining a search key comprises:
determining a column offset of the selected data table based on a location of the selected data table within the CAM; and
generating the search key by shifting the search word by a number of bits indicated by the column offset.

* * * * *